(12) United States Patent
Kastalsky

(10) Patent No.: US 8,785,309 B2
(45) Date of Patent: Jul. 22, 2014

(54) SPATIAL ORIENTATION OF THE CARBON NANOTUBES IN ELECTROPHORETIC DEPOSITION PROCESS

(71) Applicant: Nano-Electroic and Photonic Devices and Circuits, LLC, Bridgeport, PA (US)

(72) Inventor: Alexander Kastalsky, Ocean, NJ (US)

(73) Assignee: Nano-Electronic And Photonic Devices And Circuits, LLC, Bridgeport, PA (US)

( * ) Notice: Subject to any disclaimer, the term of this patent is extended or adjusted under 35 U.S.C. 154(b) by 0 days.

(21) Appl. No.: 13/694,426

(22) Filed: Dec. 3, 2012

(65) Prior Publication Data
US 2014/0154847 A1 Jun. 5, 2014

(51) Int. Cl.
*H01L 29/02* (2006.01)
(52) U.S. Cl.
USPC ............ 438/573; 977/742; 977/938
(58) Field of Classification Search
None
See application file for complete search history.

(56) References Cited

U.S. PATENT DOCUMENTS 7,851,784 B2 12/2010 Kastalsky
8,492,249 B2 * 7/2013 Kastalsky .................... 438/478
2006/0052947 A1 * 3/2006 Hu .................................. 702/20
2011/0186808 A1 8/2011 Kastalsky
2013/0146836 A1 6/2013 Kastalsky
2013/0217565 A1 8/2013 Kastalsky

OTHER PUBLICATIONS

Boccaccini et al., "Electrophoretic Deposition of Carbon Nanotubes", Carbon, Jun. 12, 2006, 44, 3149-3160.
Derycke et al., "Carbon Nanotube Inter- and Intramolecular Logic Gates", Nano Letters, Aug. 26, 2001, 1(9), 453-456.
Javey et al., "Self-aligned ballistic molecular transistors and electrically parallel nanotube arrays", Nano Letters, 2004, 4(7), 1319-1322.

* cited by examiner

*Primary Examiner* — Zandra Smith
*Assistant Examiner* — Pamela E Perkins
(74) *Attorney, Agent, or Firm* — Baker & Hostetler LLP

(57) ABSTRACT

A new method of electrophoretic nanotube deposition is proposed wherein individual nanotubes are placed on metal electrodes which have their length significantly exceeding their width, while the nanotube length is chosen to be close to that of the metal electrode. Due to electrostatic attraction of individual nanotube to the elongated electrode, every nanotube approaching the electrode is deposited along the electrode, since such an orientation is energetically favorable. This method offers opportunity to produce oriented arrays of individual nanotubes, which opens up a new technique for fabrication and mass production of nanotube-based devices and circuits. Several such devices are considered. These are MESFET- and MOSFET-like transistors and CMOS-like voltage inverter.

18 Claims, 3 Drawing Sheets

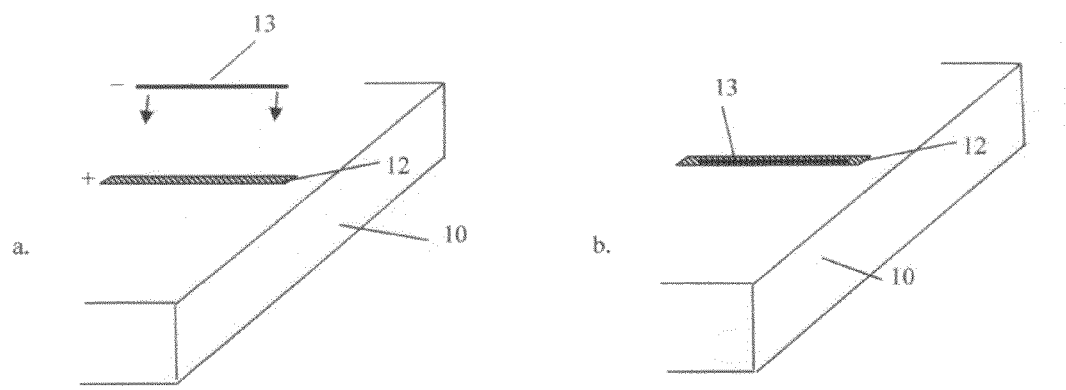
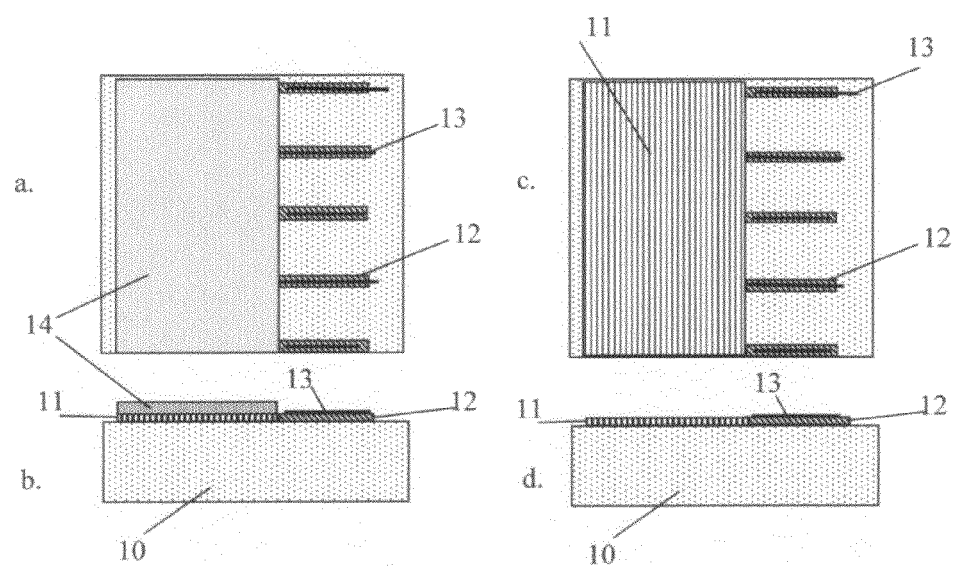
Fig.2

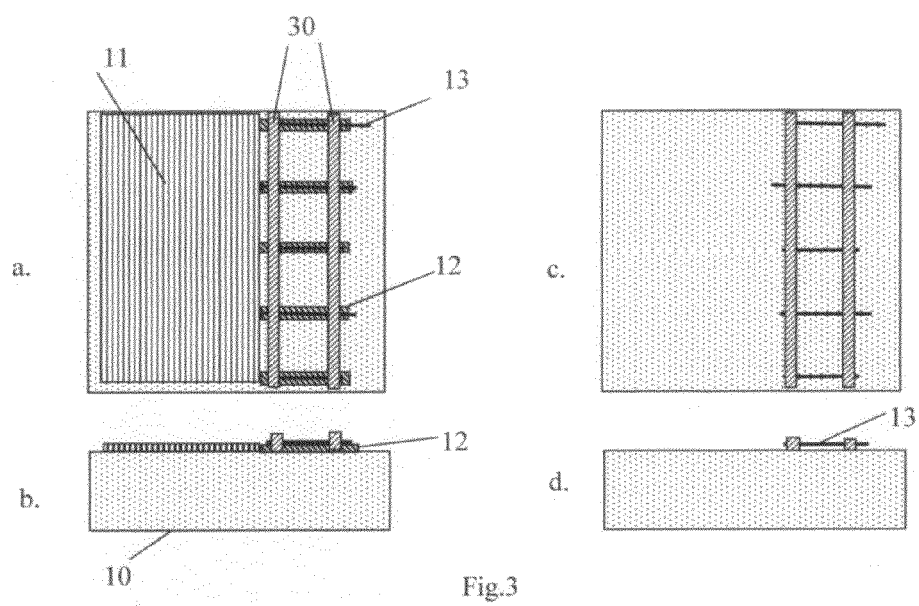
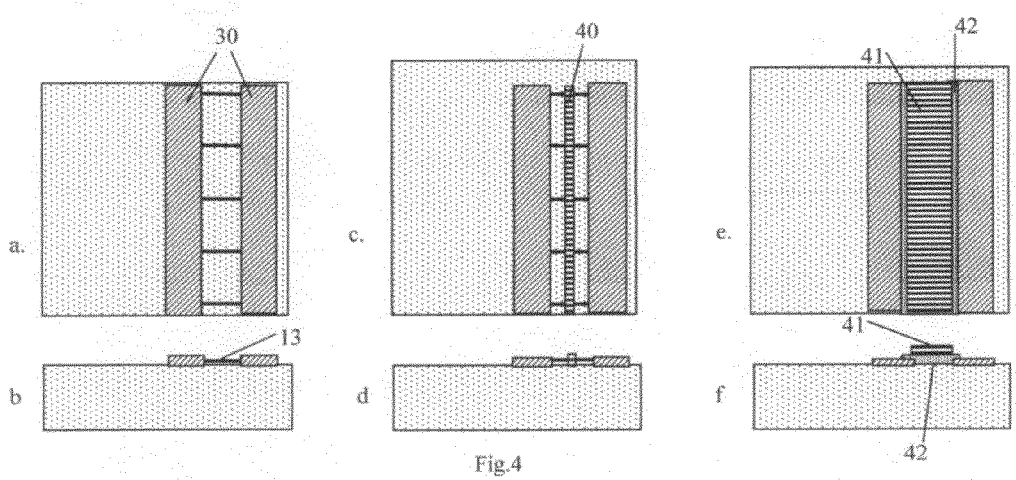

SPATIAL ORIENTATION OF THE CARBON NANOTUBES IN ELECTROPHORETIC DEPOSITION PROCESS

TECHNICAL FIELD

The invention relates to formation of the arrays of individual nanotubes in the electrophoretic process of the nanotube deposition on the array of metal electrodes having a specifically selected geometry which causes a spatial orientation of the nanotubes placed on the electrodes. The oriented nanotube arrays are used to produce new technology for fabrication of electronic and photonic devices.

BACKGROUND OF THE INVENTION

The basic technological concept of the present invention is related to a spatial orientation of the individual nanotubes during the process of their electrophoretic deposition on the appropriately chosen metal electrodes. This simple and economical method of control of the nanotube placement can be used for making a mass production technology for nanotube-based electronic and photonic devices.

Carbon nanotubes (CNT) possess unique properties that make them great candidates for future novel high-speed, high efficiency electronic and photonic devices. These properties include: two-dimensional quantization of the energy spectrum (quantum size effect), ballistic electron propagation along the tube, current densities as high as $10^9$ A/cm$^2$ (vs. $10^6$ A/cm$^2$ in Si FET channel), existence of a semiconductor phase, possibilities for n- and p-doping with a high carrier mobility, as well as excellent thermal conductance, make the CNT-based devices an excellent material for the future replacement of the Si-based electronics. All these semiconductor features are characteristic of specific, Single Walled CNT (SWNT), and only these nanotubes will be used in the proposed invention.

In addition, the optically active, direct interband and intraband photon transitions, make the nanotubes a strong contender to III-V optoelectronic devices. Furthermore, when made on a Si wafer, CNT can produce a combination of electronic and optoelectronic circuits combined with Si electronics, thus making hybrid electron and photon circuits on the Si wafer.

The key element widely used in the electronic logic circuits is voltage inverter (CMOS), wherein both switching states consume minimum energy. It is vitally important for future development of electronics beyond the Si world to mass produce such an element using CNT technology. The attempts to build CNT inverter have been carried out in many research places worldwide. Typically, it is made from nanotubes extended between source and drain metal contacts deposited on the Si substrate, while the controlling gate electrode is made simply by placing the nanotube on top of the SiO$_2$ insulating layer grown on the n+ Si substrate. Such a design is utilized in essentially all publication on this topic, for both inverter circuit and individual transistors. The drawback of this method is its impracticality for any scale of circuit integration: placement of multiple identical nanotubes to enhance the output current or to form new circuit elements requires a special micro-manipulator and thus precludes any possibility of IC mass manufacturing. Another problem related to placement of the nanotubes onto SiO2/n+Si base is existence of only one gate electrode common to all the nanotubes involved, namely, the n+Si wafer separated from the nanotubes by an oxide dielectric.

Another technology of making SWCNT arrays comes from the nanotube vertical growth in the CVD process, see e.g. A. Kastalsky U.S. Pat. No. 7,851,784. This method however requires formation of extremely small pads of catalytic material of less than 5 nm in diameter which is unachievable even for e-beam lithography. Different methods of further reducing the catalytic metal pad area are considered (see e.g. A. Kastalsky, US Patent Application #20110186808, or A. Kastalsky U.S. patent application Ser. No. 13/401,220, filed Feb. 21, 2012). The future success of CNT devices will rely on emergence of new and simple manufacturing processes which both provide a good control of the nanotube placement, orientation and uniformity of their properties and ensure a high-yield, large volume production and cost efficiency above the modern electronic and photonic semiconductor technologies.

SUMMARY OF THE INVENTION

The electrophoretic deposition (EPD) of the nanotubes from the nanotube suspension is economical, simple and versatile method of the nanotube placement on the metal electrode. The only significant deficiency of this technology is related to the fact that nanotube deposition results typically in a placement of chaotic and disoriented bundles of the nanotubes on the metal surface, see e.g. A. R. Boccaccini et al. Science Direct, Carbon, 44, p. 3149, 2006. This practically prevents utilization of this method for fabrication of electronic and photonic devices having array of single, separated from each other nanotubes, a very desirable feature for future nanotube applications. It is therefore of importance to find a way to electrophoretically produce arrays of individual nanotubes with controllable orientation and separation from each other.

The proposed, according to the present invention, modification of the electrophoretic CNT deposition method is best suited for this purpose. The key concept of the nanotube orientation and separation during the electrophoretic process stems from the favorable electrostatic attraction of two oppositely charged conductive objects having shapes of long wires. If the length of these wires significantly exceeds their width, then the electrostatical attraction is preferable for mutually parallel orientation of these wires. The description of such an EPD process is the first object of the present invention.

The electrophoretically disposed oriented and spatially controlled SWCNT arrays can be used for fabrication of the analogues of semiconductor devices, such as transistors (MOSFET-like and MESFET-like CNT transistors) and CMOS-like circuits, as well as photonic devices described by A. Kastalsky in the U.S. patent application Ser. No. 13/313, 554, filed Dec. 7, 2011, wherein intra-subband optical transitions are considered. The description of the technology for making above mentioned electronic devices is the second subject of the present invention.

BRIEF DESCRIPTION OF THE DRAWINGS

FIG. 1. Schematic illustration of the electrostatic attraction of a nanotube to a long and narrow metal stripe.
 a. The nanotube in the suspension approaches the metal electrode;
 b. The nanotube is deposited on the metal electrode.
FIG. 2. Top view a. and cross-sectional view b. of the metal comb, having its base covered with an insulator, while narrow teeth contain single nanotubes on every tooth;

Figure 5:
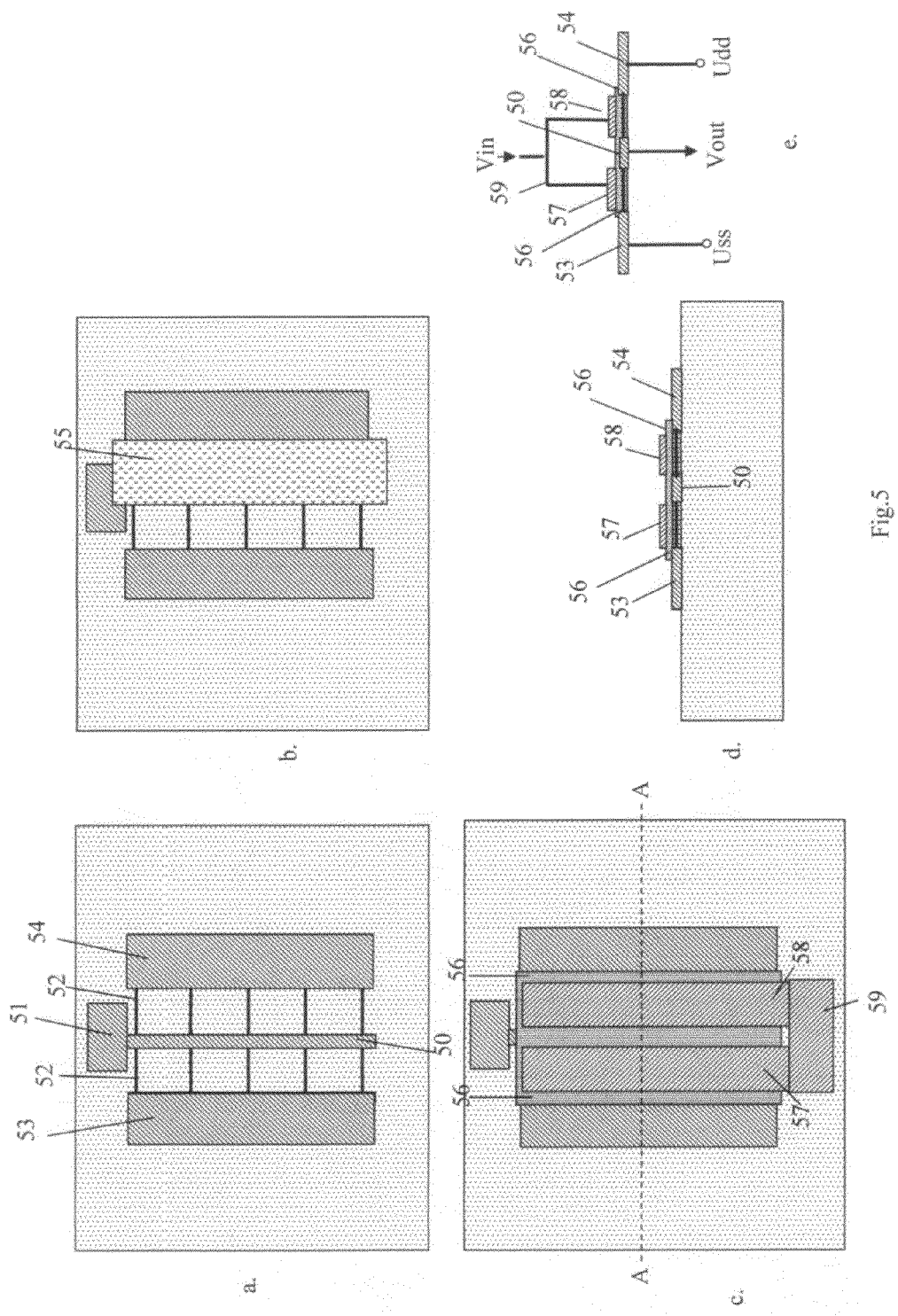

c. and d. show the same comb structure with the dielectric layer removed.

FIGS. 3a. and b. show top and cross-sectional views of the comb structure with contact stripes deposited on the nanotubes;

c. and d. show the same structure with the comb metal removed.

FIG. 4 a.b.—deposition of the contacts on the nanotube array, c. d.—deposition of the gate metal stripe on the nanotube array, e. f.—deposition of a layer of insulator on the nanotube array followed by deposition of the gate metal.

FIG. 5 Fabrication of the complementary voltage inverter.

a.—the inverter structure of two nanotube arrays, having source and drain contact stripes and the metal contact stripe in the middle;

b.—the inverter structure with transistor on the right covered with an insulator;

c.—top view of the complete inverter structure;

d.—the cross-sectional view of the inverter;

e.—biased inverter circuit.

DETAILED DESCRIPTION OF THE INVENTION

As discussed above, the main drawback of the original method of the electrophoretic deposition of the nanotubes results from a random orientation and positioning of the nanotubes on the metal electrode. A new electrophoretic method of the nanotube deposition, according to the present invention, offers placement of the nanotubes on the metal electrodes with the nanotube orientation parallel to the electrode length. This method eliminates all the above mentioned problems and make the EPD processing technique a reliable and simple method for CNT device technology.

FIG. 1 illustrates this method. The nanotube 13, carrying the electrostatic charge opposite to that of the elongated electrode 12 and having the length comparable to the electrode length, approaches the metal electrode 12 due to electrostatic metal-to-nanotube attraction. In this case, maximum electrode-to-nanotube capacitance occurs when nanotube is oriented parallel to the electrode length. This implies that the mutual (negative) energy of attraction in this case will be at its minimum, which makes such an orientation energetically favorable. Thus, a long nanotube deposited on a metal electrode, having large length-to-width ratio, will be attached to the electrode and oriented along the electrode length.

It is preferable to have opposite Coulomb charges on the metal electrode and the nanotube equal to each other, so that the nanotube placed on the electrode will neutralize the charge on the metal thereby preventing deposition another nanotube on the same electrode. For the same reason it is also desirable to minimize the density of the nanotubes in the electrophoretic solution and reduce the deposition voltages while keep the deposition process short. Thus, every metal electrode will acquire a single nanotube directed along the electrode length thereby producing the arrays of oriented nanotubes when the metal electrodes underneath the nanotubes are selectively etched (see below).

FIG. 2 shows the electrode design prepared for fabrication of the spatially oriented nanotubes. To make an array of the nanotubes, it is practical to combine several long and narrow metal electrodes 12 attached to the common metal pad 11, so that the original metal structure represents a "comb" with the base electrode 11 covered with an insulator 14, see FIGS. 2 a. (top view) and b. (cross-sectional view), to prevent nanotube deposition on this portion of the comb, while tooth portion of the comb consists of narrow metal teeth 12 which remain exposed.

The nanotube length is supposed to be longer than the tooth width, otherwise the nanotube-electrode capacitance will be essentially the same for all orientations, and thus spatial selectivity will be lost. On the other hand, the tooth width should not be smaller than the resolution of the modern photolithography, to build a cost effective technology applicable to the large scale production. The optimum conditions for the selective deposition would be tooth width of 0.5-1 µm, and tooth and nanotube length of ~5-10 µm.

FIGS. 2a and b illustrate the comb structure where the nanotubes are deposited on the teeth, while the base is covered with the insulator 14. Once the nanotubes are placed on the metal electrode, the dielectric 14 is removed, see FIGS. 2c. and d.

FIG. 3 shows the further processing of the structure applicable to fabrication of the devices of interest. Two metal stripes 30 are first deposited across all the nanotubes in the array to form contacts to the nanotubes, FIG. 3a.,b. The nanotubes applicable to the fabrication of electronic and photonic devices are predominantly Single Walled Nanotubes (SWNT) with p-type original conductivity. The best, practically ohmic, contacts to p-type nanotubes are palladium (Pd) contacts, see e.g. A. Javey et al. Nano Letters V.4, 1319, 2004. The contacts to the nanotubes are made preferably using sputtering metal deposition process to make the contact metal wrapped around the nanotube and thus minimize the contact resistance.

The contact deposition is followed by the selective etching of the metal comb structure 11/12 underneath the nanotubes to release the nanotubes from the metal. Al or Ti are the best metal materials for the comb 11/12, easily removable with wet or dry etching. FIGS. 3 c. and d. show the resultant nanotube array with two Pd contacts across the nanotubes. These are the source and the drain contacts for the entire nanotube transistor array which in the presented example consists of 5 nanotubes.

Contact deposition is followed by fabrication of the gate electrode, see FIG. 4, for all nanotubes in the array. FIG. 4a.b. shows the device structure, with two (source and drain) contacts to the nanotube array, prior to the gate deposition. Two different gate configurations are considered. In one case, see FIGS. 4c. and d., a narrow gate electrode 40 is placed in the middle of the nanotube length directly on the nanotubes. In this case a high Schottky barrier metal is used as a gate electrode to produce the transistor action. For p-type nanotube, Al or Ti are the best metals for this purpose, see e.g. M. Yang et al. Appl. Phys. Lett. 87, 253116, 2005. Again, to provide a good contact of the gate metal around the nanotube the metal sputtering process is preferable. This three-terminal structure represents an analogue of the MESFET, (see e.g. S. M. Sze, Physics of semiconductor devices, 1969), as discussed in the U.S. patent application Ser. No. 13/313,554, filed Dec. 7, 2011 by A. Kastalsky, where positive gate voltage applied to the p-type nanotube relative to the source or drain contact reduces the hole density in the nanotube area under the gate, thereby lowering the total nanotube conductance. As follows from the FIG. 4, after removal of the comb metal layer the nanotube becomes slightly elevated above the substrate which allows one to make the gate electrode 40 wrapped around the nanotube, thereby increasing the transistor efficiency.

FIGS. 4e. and f. show different gate design, in which the gate electrode 41 is deposited on the dielectric layer 42, to eliminate the direct gate-to-nanotube connection and thus produce the MOSFET-like transistor structure. This design is suitable for both p- and n-type nanotubes, see below. It is important that both the gate metal 41 and the insulator 42 cover whole exposed nanotube length 13, see FIG. 4b. This implies that the gate length is equal to the nanotube length 13. It is important that the width of the dielectric pad 42 exceeds the active nanotube length 13 to protect the gate electrode 41 against short to the contacts 30.

The MOSFET-like transistor structure can be used for making a nanotube-based complementary voltage inverter, analogous to Si-based CMOS. For this purpose, one needs both p- and n-type transistors connected in a specific CMOS circuit. There are two known methods of conversion of the originally p-type SWNT into n-type nanotube, see V. Derycke et al. Nano Letters, V.1 #9, 453, 2001. One method is based on the annealing of the p-type nanotube in vacuum. In this case, the source-to-nanotube Schottky barrier is lowered down to the conduction band level of the nanotube, so that the electrons can move along the nanotube when positive gate voltage is applied. In the second case, the nanotube is modified by introducing n-type doping, made by exposure the nanotubes to potassium (K), while the contact Schottky barrier remains unchanged. In this case, the electron conductance along the nanotube begins only at a high donor density and large gate-to source voltage, sufficient to provide the electron tunneling through the Schottky barrier, see V. Derycke et al. Appl. Phys. Lett. V.80, 2773, 2002.

The first method is deemed to be preferable for the inverter circuit, since in this case the gate action in the n-type transistor starts at low gate voltages (there is no need for electron tunneling through the Schottky barrier), while the electron conductance is not varied by the doping and hence is similar to the hole conductance in the p-type nanotube, thus maintaining the inverter voltage symmetry.

FIG. 5 illustrates the fabrication process of the CMOS-like voltage inverter, according to the present invention. Two arrays of the SWNTs 52 are attached to each other through the mutual contact 50 having the output electrode 51, see FIG. 5a. The nanotubes in both arrays are p-type and similar to each other. The contact electrodes 53 and 54 represent respectively the source contact for the left array and drain contact for the right array, while the middle common electrode 50 is the source electrode for the right transistor and the drain electrode for the left transistor.

To produce the n-type nanotubes, the right nanotube array is protected with the insulator 55, FIG. 5b. The preferred insulator for this purpose would be a ~10 nm-thin layer of silicon oxide, see V. Derycke et al. Nano Letters, V1, 9, 2001, p. 453. After annealing of the device in vacuum and removal of oxygen in the nanotubes, both arrays are converted into n-type due to lowering of the Schottky barrier for electrons, see V. Derycke et al. Appl. Phys. Lett. V.80, 2773, 2002. However, after annealing the structure in oxygen, the right array 52, protected by the insulator 55, will maintain n-type conductivity, while the left one will be converted back to the p-type. As discussed before, the contact material with the smallest Schottky barrier for p-type nanotubes is Pd and therefore this material is preferable for the p-type (left) contacts 53 and 50. It is followed by removal of the insulator 55 and deposition on both arrays of the gate insulator 56, FIG. 5c. The gate insulator 56 covers both nanotubes, middle common electrode 50 and partially nanotube contacts 53 and 54. Then the separate gate metal stripes 57 and 58, connected to the output contact 59, are deposited on the gate insulator pad 56 which is, as in the above discussed MOSFET-like case, extends wider than the metal pads 57 and 58 to prevent shorts to the source and drain contacts 53 and 54.

FIG. 5d shows a cross-sectional view of the inverter taken across the line AA. It is important that the gate metal pads 57 and 58 cover the entire length of the exposed nanotubes in both arrays thereby forming two (p- and n-type) MOSFET-like transistor arrays connected in series to produce the inverter circuit.

The illustrated in FIG. 5 inverter design is believed to be more attractive for large scale integration than that described in V. Derycke et al. Nano Letters, V.1 #9, 453, 2001. The latter operates with only one nanotube, while it is extremely desirable to construct the devices with multiple controllable nanotubes oriented in one required direction as proposed in the present invention. Then, in their design the nanotube is placed on the metal contacts and therefore, is elevated above the gate dielectric ($SiO_2$ on n+Si), thereby introducing uncertainty in the total gate insulator thickness and therefore the active (gate) transistor capacitance. Also, even if the nanotube is continuously attached to the $SiO_2$ layer, the nanotube touches the gate insulator only within the line along the nanotube cylinder, thus reducing the transistor efficiency. In the proposed case, according to the present invention, both contacts 53 and 54, as well as gate insulator 56 and gate metals 57 and 58 on it, cover the nanotubes around the whole nanotube cylinder thereby enhancing the device performance. Finally, in the design, according to the present invention, there is no need for expensive Si wafer as a substrate for the inverter, and a simple piece of glass can be used. On the other hand, the invented technology can be implemented on the Si wafer as well, thereby providing the opportunity for hybrid circuits and devices, combined from both Si-based and nanotube-based elements.

FIG. 5e shows schematically the inverter circuit according to the present invention. Constant $V_{ss}$ and $V_{dd}$ voltages are applied to respective source and drain contacts 53 and 54 of the circuit, while the input voltage $V_{in}$ is applied to both gates 57 and 58 connected together with the contact pad 59, see FIG. 5c. The output voltage $V_{out}$ from the common to both transistors electrode 50 changes when the appropriate input gate voltage $V_{in}$ is applied.

Thus, the proposed according to the present invention technology of electrophoretic deposition of separated, oriented nanotubes allows fabrication of the multiple arrays of individual nanotubes with controllable orientation, thereby providing new reliable method for making of the nanotube transistors and optoelectronic circuits and devices. The proposed simple and cost effective device processing for making any desirable nanotube array is best suited for large scale device integration with a high throughput.

The invention claimed is:

1. A method of orienting nanotubes, said method comprising electrophoretically depositing nanotubes on an array of metal electrodes, each metal electrode having a high length-to-width ratio, and a width that is substantially less than the length of the nanotubes, so that during the electrophoretic deposition, each electrostatically charged nanotube approaches the nearest said metal electrode having an opposite electrostatic charge and acquires an energetically preferable orientation parallel to the length of said metal electrode, thereby producing a spatially selective placement of the nanotube along said metal electrode.

2. The method of claim 1, wherein the electrostatic charges on the individual nanotube and said metal electrode are opposite and equal to each other, so that the nanotube placed on said metal electrode nullifies the total charge in the nanotube-metal pair and thereby prevents placement of another nanotube on the same said metal electrode.

3. The method of claim 1, wherein said metal electrode and the nanotube have lengths in a range of from about 5 to about 10 μm, while the width of said metal electrode is in a range of from about 0.5 to about 1 μm.

4. The method of claim 1, wherein said metal electrode is made from the material which is selectively removable with wet or dry etching, so that after etching of said metal electrode the nanotube remains connected to the substrate through the contact electrodes deposited to the ends of every nanotube prior to etching of said metal electrodes.

5. The method of claim 1, where all deposited nanotubes are p-type semiconductor single walled carbon nanotubes, suitable for making electronic and photonic devices.

6. The method of claim 5, wherein said contact electrodes can be made from material with low Schottky barrier to the nanotubes to provide a low resistive contact to the nanotube.

7. The method of claim 6, wherein said material with low Schottky barrier is Pd.

8. The method of claim 1, wherein said contact electrode can be made from material with a high Schottky barrier to the nanotubes to provide a highly resistive contact to the nanotube.

9. The method of claim 8, wherein said material with a high Schottky barrier to the nanotubes is Al or Ti.

10. A method of fabricating nanotube-based MESFET-like transistor, using the method of claim 1, said method further comprising:
depositing a metal layer having shape of a comb on a dielectric substrate, said comb characterized as having an electrically connective base and teeth, each of said teeth having a large length-to-width ratio, wherein the base of said comb is then coated with a dielectric layer, leaving the metal teeth of said comb exposed;
electrophoretically depositing single walled nanotubes on said metal teeth of said comb by placing opposite and equal charges on each of said metal teeth and the nanotube, the length of each nanotube being similar to that of the length of each of the metal teeth;
depositing two narrow metal stripes of low resistive contacts to the nanotube ends, wherein said metal stripes wrap around every nanotube to minimize the contact resistance;
removing the metal comb, so that the nanotubes remain attached to the substrate via said narrow metal stripes;
depositing a narrow gate metal electrode intersecting the nanotube or nanotube array in the middle of the nanotube length, wherein the gate metal has a high Schottky barrier to the nanotubes;
depositing output metal electrodes to said low resistive contacts on the nanotube sides, thereby providing source and drain contacts to the nanotube transistor; and
depositing a metal contact layer to the gate metal thereby providing the gate output electrode.

11. The method of claim 10, wherein single walled nanotubes are p-type, the ohmic source and drain contacts are made from Pd, and the high Schottky barrier materials are Al or Ti.

12. A nanotube-based transistor made by the method of claim 10.

13. A method for fabricating a nanotube-based MOSFET-like transistor, using the method of claim 1, said method further comprising:
depositing a metal layer on a dielectric substrate, said metal layer having shape of a comb, said comb characterized as having an electrically connective base and teeth, each of said teeth having a large length-to-width ratio, wherein the base of said comb is then coated with a dielectric layer, leaving the metal teeth of said comb exposed;
electrophoretically depositing of single walled nanotubes on said metal teeth of said comb by placing opposite and equal charges between each of said metal teeth and the nanotube, the length of each nanotube being similar to that of the length of each of the metal teeth;
depositing two narrow metal stripes of low resistive contacts to the nanotube ends, wherein said metal stripes wrap around every nanotube end to minimize the contact resistance;
removing the metal comb, so that the nanotubes remain attached to the substrate via said narrow metal stripes;
depositing the dielectric layer on top of the nanotube or nanotube array, said dielectric layer covering both the entire nanotube length and partially some portions of said two narrow metal stripes;
depositing the gate metal layer on top of said dielectric layer, said gate metal layer covering the entire nanotube length between said two metal stripes;
depositing the output metal electrodes to said low resistive contacts on the nanotube sides using uncovered by dielectric layer portions of said two narrow metal stripes, thereby providing source and drain contacts to the nanotube transistor; and
depositing a metal contact layer to said gate metal layer, thereby forming the gate output electrode.

14. The method of claim 13, wherein single walled nanotubes are p-type, while the ohmic source and drain contacts are made from Pd.

15. A nanotube-based transistor made by the method of claim 13.

16. A method of making a nanotube-based complementary voltage inverter, using the method of claim 1 said method further comprising:
depositing first and second metal layers on a dielectric substrate, each metal layer having shape of a comb, each comb characterized as having an electrically connective base and teeth, each of said teeth having a large length-to-width ratio, said combs arranged such that the respective teeth are facing and aligned with one another, wherein each base of said combs is then coated with a dielectric layer, while leaving the metal teeth of each comb exposed;
electrophoretically depositing single walled nanotubes on each metal comb, one nanotube on each metal tooth of each comb, by placing opposite and equal charges between each of said metal teeth and the nanotubes, the nanotubes being of p-type and having the length similar to that of the length of each of the exposed metal teeth, thereby providing a first set of single walled nanotubes on said first metal layer comb, a second set of single walled nanotubes on said second metal layer comb, wherein the deposited p-type nanotubes on each pair of aligned facing teeth of said first and second metal layer combs are positioned to be co-linear with one another;
depositing three metal stripes, each of low electrical resistivity, to the nanotubes arranged across the aligned teeth of each metal comb, such that the first metal stripe contacts and electrically connects the first set of nanotubes at the base end of the first comb, the second metal stripe contacts and electrically connects the second set of nanotubes at the base end of the second comb, and the third metal stripe contacts and electrically connects the first and second sets of collinear aligned nanotubes to one another to form a plurality of serial circuits of nanotubes;

removing the metal teeth of the combs, so that the nanotubes remain attached to the substrate via said three narrow metal stripes;

coating the first set of nanotubes, but not the second set of nanotubes, with a dielectric layer;

annealing of both sets of nanotubes in vacuum to convert them into n-type conductivity;

exposure of both said sets of nanotubes to oxygen atmosphere to convert uncoated nanotube back to p-type conductance, while the coated nanotube remains of n-type, such that the two sets of nanotubes connected in series have respective p-type and n-type conductance;

removing said dielectric layer;

depositing a second dielectric layer so as to cover both exposed portions of the nanotubes, the third contact stripe between them, and a portion of the first and second metal stripes;

depositing two gate metal layers on top of said dielectric layer, said gate metal layer superposed on the nanotube lengths between contact pads in both nanotubes;

depositing four metal electrodes as output contacts to the inverter circuit, wherein two electrodes out of said four are attached to the respective said two contact pads at the ends of said circuit of the two nanotubes in series, while two remaining electrodes are attached respectively to said gate metal layers connected together and said third contact pad in the middle of the circuit.

17. The method of claim 16, wherein said two spatially separated single walled p-type nanotubes are replaced with two spatially separated arrays of single walled p-type nanotubes.

18. A nanotube-based complementary voltage inverter made by the method of claim 16.

* * * * *